United States Patent
Houston

(10) Patent No.: US 6,639,826 B2
(45) Date of Patent: Oct. 28, 2003

(54) MEMORY CELL OPERATION USING RAMPED WORDLINES

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/036,296

(22) Filed: Dec. 31, 2001

(65) Prior Publication Data

US 2002/0122330 A1 Sep. 5, 2002

Related U.S. Application Data

(60) Provisional application No. 60/259,312, filed on Dec. 31, 2000.

(51) Int. Cl.$^7$ .............................................. G11C 11/00
(52) U.S. Cl. ........................ 365/154; 365/228; 365/227; 365/229; 365/185.19
(58) Field of Search ................................. 365/154, 228, 365/227, 229, 233.5, 185.19

(56) References Cited

U.S. PATENT DOCUMENTS

| 5,687,115 | A | * | 11/1997 | Wong et al. | ........... 365/185.03 |
| 6,038,166 | A | * | 3/2000 | Wong | ..................... 365/185.03 |
| 6,343,044 | B1 | * | 1/2002 | Hsu et al. | .................... 365/227 |
| 6,483,739 | B2 | * | 11/2002 | Houston | ..................... 365/154 |

* cited by examiner

Primary Examiner—David Nelms
Assistant Examiner—Connie C. Yoha
(74) Attorney, Agent, or Firm—Peter K. McLarty; W. James Brady, III; Frederick J. Telecky, Jr.

(57) ABSTRACT

The standby power consumption of storage or memory cells is improved by ramping the wordline voltage down at a rate slow enough to allow the addressed storage cell to reach a more stable voltage before reading. The voltage change applied to the wordline can be staged through a series of intermediate voltages.

1 Claim, 2 Drawing Sheets

MEMORY CELL OPERATION USING RAMPED WORDLINES

This application claims the benefit of 60/259,312 filed Dec. 31, 2000.

BACKGROUND AND SUMMARY OF THE INVENTION

The present invention relates to integrated circuit structures and fabrication methods, and particularly to storage cells.

BACKGROUND

Loadless SRAMs have been an important recent development in memory technology. Like conventional 4T or 6T SRAMs, loadless SRAMs include a "latch" (a cross-coupled pair of driver transistors) whose state corresponds to the stored data; but conventional SRAMs must have a load of some sort to maintain the state of the latch. (In a conventional 4T SRAM cell the load is provided by a special high-impedance element, which complicates fabrication; in a conventional 6T SRAM cell the load is provided by another pair of cross-coupled transistors, of opposite type to the driver transistors.) Loadless SRAMs do not have any such load: instead, the data state is maintained merely by leakage current through the pass transistors.

To maintain the data state, the leakage current into the high node must be greater than the leakage current through the driver transistor which connects the high node to ground.

Refresh at Beginning of Active Cycle

The present application discloses an improvement to storage cells. The wordline to accessed cells during read is pulled down incrementally, or in a gradual fashion, to allow the accessed storage cell to reach a more stable state before the pass transistors are fully turned on, which allows the cell to not be upset when accessed. It also allows the cells to be maintained at lower power consumption when not accessed or during standby.

Advantages of the disclosed methods and structures, in various embodiments, can include one or more of the following:

saves power in standby;

higher power only used in accessed rows, leaving unaddressed cells to sag and save power.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
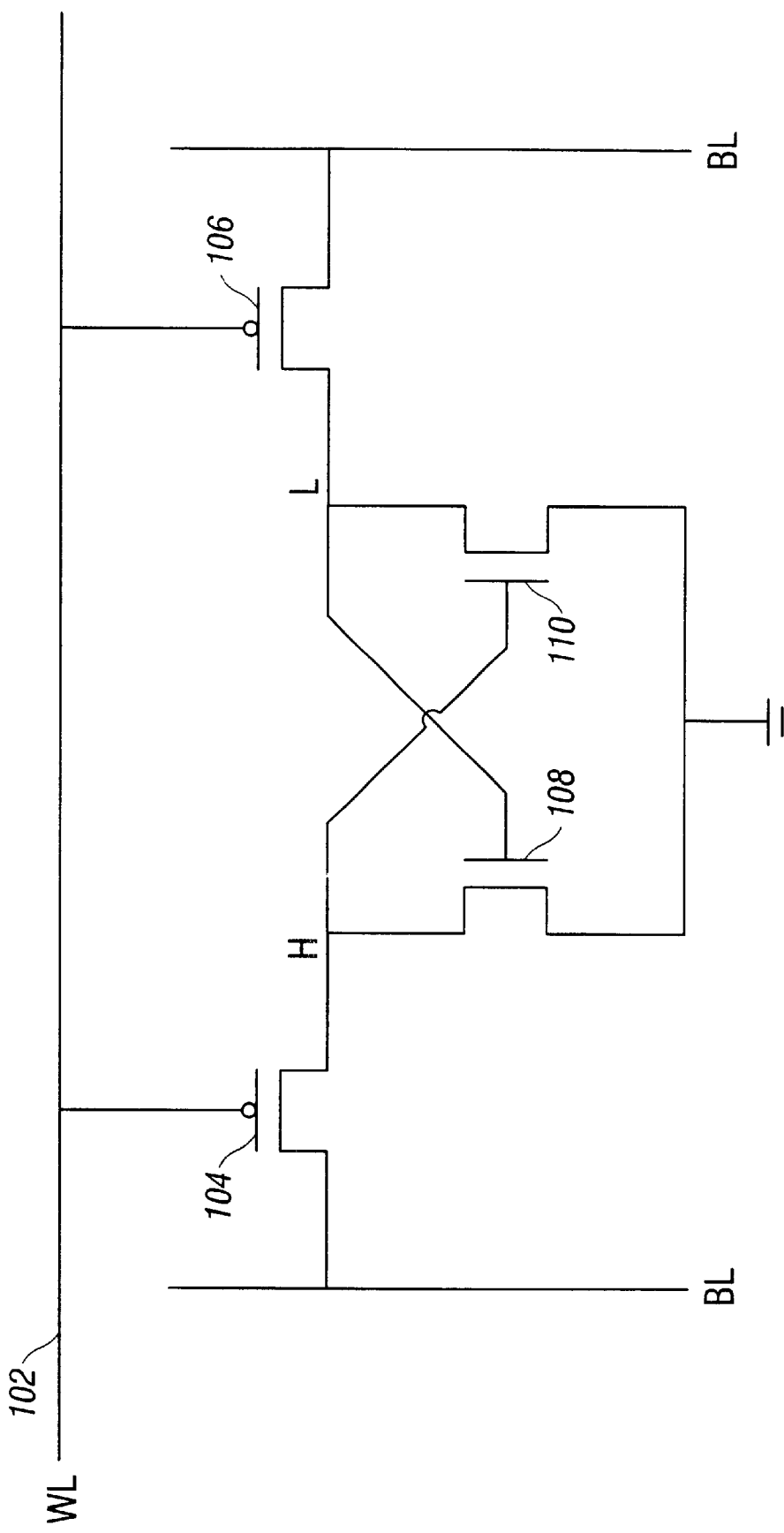
FIG. 1 shows a 4T SRAM cell.

FIG. 1 shows a 4T SRAM loadless memory cell for use in the preferred embodiment. The wordline 102 connects to the pass transistors 104, 106, which control voltage levels on the drive transistors 108, 110. The high node must maintain a minimum voltage during standby in order to be stable. This is done by keeping the wordline relatively high, which allows the high node's voltage to sag to a minimum level and still maintain its state. During access, instead of immediately turning on the wordline voltage to its maximum on state (or standard on state) amount, the wordline is ramped on more slowly than could be achieved with the technology (e.g., 1 ns vs 0.2 ns), which allows the storage nodes to reach more stable, higher voltage states before the pass transistor is fully turned on.

Figure 2A:
FIGS. 2a–2c show different rampdown profiles for the wordline.
Figure 2B:
Figure 2C:

FIGS. 2a–2c show the changing of the wordline voltage before accessing a particular row. FIG. 2a shows a sloping decrease, with one undersized pulldown.

FIG. 2b shows the voltage with two pulldowns with staggered turn ons. FIG. 2c shows a staged pulldown of the wordline.

Figure 3:
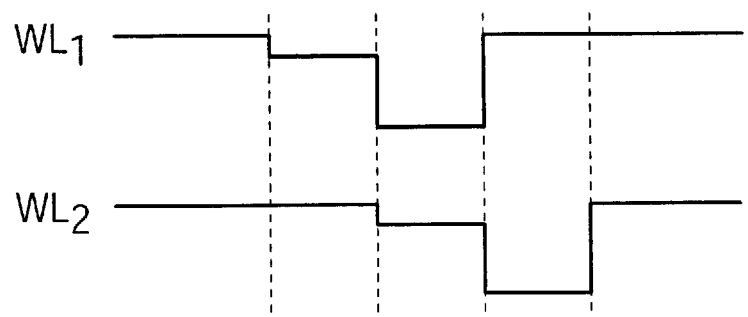
FIG. 3 shows pipelined rampdowns for the wordline.

FIG. 3 shows a pipelined pulldown of two wordlines. In this, two reads are accomplished, and the pulldown times are staggered so as not to waste clock cycles.

When a bit is addressed in a storage array, that bit is most in danger of being upset because the low node will be pulled up somewhat by the turned on pass gate. Thus for read, if the addressed row is taken care of, the rest will retain their state as well(assuming the cell is stable in standby). In the preferred embodiment, the wordline initial pull-down is ramped, or done in stages. In any event, the wordline pulldown takes longer than minimum, which slows the read cycle, but allows the storage node to reach a higher voltage state where it will not be upset on accessing. The initial delay of the access pulls the high side higher, restoring it before the pass gate is fully turned on. This only needs to be done to the addressed row. All other wordlines may be maintained high normally. This initial dip is done by controlling the supply to the wordline driver circuits.

In another embodiment of the present innovations, on a read cycle, all the wordlines are dipped a bit at the start of the cycle, and then all are restored to high except the selected wordline. This initial dip can be done in parallel with the decoding of the address. This avoids slowing the read. For this approach, the bitline precharge is kept on during the initial dip of all wordlines. The initial dip is accomplished by control of the wordline drivers.

For either embodiment (i.e., only the addressed wordline or all wordlines dipped), this process may be done for every read cycle, or only on the first read cycle from standby. The latter can be the case if a different unaccessed WL voltage is maintained in standby versus in active.

For write coming out of standby, the situation is different. The addressed cell is not in danger of upset; however, unaddressed cells on the same word line as addressed cell(s) can be upset, just as for a READ. An additional potential problem is that if an unaddressed cell in the same column as an addressed cell is at a minimum storage voltage, it may lose more voltage during the write cycle if the high is on the side where the bit line is pulled low for write. This potential problem is addressed by ensuring there is enough reserve in the storage node voltage in standby to last through a write cycle.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

In particular, the sample embodiment above was described for n-channel drivers and p-channel pass transistors, but could be reversed (with associated change in voltage polarity).

What is claimed is:

1. A method of operating a SRAM memory cell, comprising:

setting an unaccessed WL voltage such that the SRAM memory cell is subject to upset upon a fast ramp of the WL voltage for access; and ramping the WL voltage slowly to a first voltage and then more rapidly to a second voltage wherein the first voltage is intermediate to the unaccessed WL voltage and the second voltage.

* * * * *